United States Patent [19]

Männer

[11] Patent Number: 5,304,965
[45] Date of Patent: Apr. 19, 1994

[54] SURFACE WAVE TRANSDUCER, ESPECIALLY OF SPLIT FINGER DESIGN, WITH SUPPRESSION OF REFLECTIONS OF TERMINAL TRANSDUCER FINGERS

[75] Inventor: Oswald Männer, Vienna, Austria

[73] Assignee: Siemens Aktiengesellschaft, Munich, Fed. Rep. of Germany

[21] Appl. No.: 927,499

[22] PCT Filed: Mar. 28, 1991

[86] PCT No.: PCT/DE91/00277
§ 371 Date: Sep. 29, 1992
§ 102(e) Date: Sep. 29, 1992

[87] PCT Pub. No.: WO91/15897
PCT Pub. Date: Oct. 17, 1991

[30] Foreign Application Priority Data

Mar. 30, 1990 [DE] Fed. Rep. of Germany ....... 4010310

[51] Int. Cl.$^5$ ............................................. H03H 9/00
[52] U.S. Cl. .................................. 333/194; 333/193; 310/313 R; 310/313 B
[58] Field of Search ............... 333/193, 194, 195, 196; 310/313 R, 313 B, 313 C, 313 D

[56] References Cited

U.S. PATENT DOCUMENTS 4,162,465  7/1979  Hunsinger et al. .................. 333/151
4,263,569  4/1981  Moellmer ............................ 333/151
4,701,657  10/1987 Grassl ................................. 310/313

FOREIGN PATENT DOCUMENTS 0088400   9/1983  European Pat. Off. .
2839851  12/1979  Fed. Rep. of Germany .

OTHER PUBLICATIONS

"Efficient Modeling of Transduction & Reflection Properties of Finite Aperiodic SAW Transducers" by O. Manner et al, IEEE Ultrasonic Symposium (1985), pp. 78–81.

Primary Examiner—Robert J. Pascal
Assistant Examiner—Darius Gambino
Attorney, Agent, or Firm—Hill, Steadman & Simpson

[57] ABSTRACT

A surface wave transducer has measures for suppressing internal reflections on terminal fingers of a transducer having other transducer fingers, which are arranged interdigitally adjacent to the terminal fingers, which are arranged corresponding to a specified acoustic wavelength of the transducer at intervals specified by a predetermined scheme and which are designed with finger widths that are likewise specified by the predetermined scheme. On each end of the transducer only a plurality of terminal fingers, which are connected to one busbar of the transducer, are positioned deviating from the scheme for positionings and finger widths of the other transducer fingers and are positioned deviating in their finger strip width. Phases and amplitudes of wave components, which would otherwise be reflected by the terminal transducer fingers and by an adjacent final transducer finger of the other transducer fingers, which corresponds to the scheme of the transducer, are modified such that the wave components intrinsically interfere destructively with one another.

2 Claims, 1 Drawing Sheet

SURFACE WAVE TRANSDUCER, ESPECIALLY OF SPLIT FINGER DESIGN, WITH SUPPRESSION OF REFLECTIONS OF TERMINAL TRANSDUCER FINGERS

BACKGROUND OF THE INVENTION

The present invention relates to a surface wave for suppressing reflections of terminal transducer fingers transducer.

In order to suppress undesired reflections of the acoustic wave in the transducer and on its transducer fingers, it has been known for a long time for such (transmitting/receiving) transducers to be constructed with interdigitally arranged transducer fingers, especially as split finger transducers. In comparison with a simple interdigital transducer with adjacent transducer fingers having alternating polarity, such transducers have in each case two (if required, also in each case three) adjacent fingers which have the same polarity, that is to say they are electrically connected to one and the same busbar. In a normal, regular design of such a split finger transducer, there follow alternating with one another two (or three) transducer fingers connected to the one busbar and two (or three) transducer fingers connected to the other busbar. The center distances between successive transducer fingers (irrespective of which polarity, that is to say including the fingers within a "split finger" and apart from points at which transducer fingers are omitted) are a quarter (or a sixth) of the acoustic wavelength of the surface wave to which the relevant transducer is tuned, to be precise the wavelength of the acoustic wave in the substrate material of the transducer. The center distances of adjacent groups of two (or three) adjacent fingers of the same polarity, that is to say the center distances between alternating split fingers, is once again equal to half the wavelength, as in the case of simple transducers.

A further transducer type with suppression of internal reflections of the ultrasound waves is the third-lambda finger arrangement. This is likewise an interdigital transducer in which, as in the case of the split finger transducer, the one finger comb (with the busbar) has doubled transducer fingers and there is in each case a single finger of the finger comb of the other busbar between adjacent groups of such double transducer fingers.

For the internal regions of such a split finger transducer or third-lambda transducer, the neutralization or suppression of internal reflections in the transducer is virtually complete with correspondingly precise dimensioning. However, this unfortunately does not apply to the terminal split finger groups and finger groups. In order to achieve suppression of reflections for these as well, it is known (European reference EP-A-0,088,400) for the relevant transducers to be provided with terminal transducer fingers which are dimensioned such that their finger length is reduced in steps, in such a manner that terminal transducer fingers interact in an interfering manner with one another with respect to the reflections. A disadvantage of such an (additional) measure is, however, that such an end of stepped construction of a transducer causes distortions in the phase front of the acoustic wave of the transducer. In addition, not all the fingers of a transducer which is weighted in an overlapping manner, as is often the case, are affected completely by the acoustic wave which is received by the transducer which is operated as the receiving transducer. The efficiency of such a measure for suppressing undesired reflections occurring at the end of a transducer is also only limited.

Another method of suppressing reflections occurring on terminal fingers of an interdigital transducer is that which is described in German reference DE-B-2,839,851. Weighted fingers in the region of the transducer end are directed with essentially longitudinal components of these fingers at an oblique angle with respect to the major axis of the wave propagation, so that these fingers reflect ultrasound waves which impinge on them away in an oblique direction, by means of these obliquely positioned components of their finger lengths, that is to say said fingers do not intrinsically reflect back.

A further method (Trans. IECE Jap. Vol 64-C (1981) pages 437–438) is to design some of the terminal fingers to be shortened with respect to the mutual distance between busbars which are opposite one another, and to replace the "missing" finger length by a floating finger in each case. However, floating potentials are highly problematic in many applications.

Finally, reference should also be made to a method of suppressing reflections of terminal fingers which consists of the outermost finger of the two fingers of the terminal (consisting of these two fingers) split finger being designed to be directed obliquely with respect to the major axis direction of wave propagation. With this measure, it must be accepted that interference occurs in the phase front of the acoustic wave of the useful signal.

Reference should also be made here to U.S. Pat. No. 4,162,465 which is apparently similar to the invention which is also described in the following text. This document describes a split finger transducer in which, in contrast to split finger transducers which were known at that time and in which wave reflections are suppressed in an artificial manner at the fingers, such mechanical reflections are caused deliberately. The purpose of this measure is to compensate for, that is to say to eliminate (reflected) waves which are reflected on the electrical load by means of such deliberately caused waves. To this end, according to the teaching of this document, it is necessary, to be precise within in each case one of the two transducer combs of the interdigital transducer, to provide fingers with a finger width which deviates from the other fingers, and a deviating finger separation, one or more such fingers of the one comb being adjacent to one or more fingers of the other comb. The mechanical (MEL) wave, which compensates for the wave which is reflected electrically (regenerated) by the other load, is produced in the interior of the thus modified transducer. The dimensioning, which for this purpose is dependent on the impedance of the load, of these deviating fingers is specified. This has nothing to do with the suppression of reflections of terminal fingers of a transducer and the fingers, dimensioned according to U.S. Pat. No. 4,162,465, of the transducer described there are also not effective for this purpose.

SUMMARY OF THE INVENTION

The object of the present invention is to specify measures by means of which such reflection effects occurring at the ends of a transducer are suppressed, to be precise without other known disadvantages associated with operation occurring.

This object is achieved by means of the configuration of a transducer wherein the transducer fingers, are arranged interdigitally adjacent to the terminal fingers, are arranged corresponding to the specified acoustic wavelength of the transducer at intervals specified by a scheme corresponding to the specified design instruction, and are designed with finger widths that are also specified by the scheme. On at least one end of the transducer are positioned, a plurality of terminal fingers which are connected to only one busbar and that deviate from this scheme for the positioning and the finger width of the other transducer fingers. They deviate in their finger strip width, such that the phases and amplitudes of the wave components, which would otherwise be reflected by these terminal transducer fingers and by the adjacent final transducer finger, which corresponds to the scheme of the transducer, are modified such that these wave components intrinsically interfere destructively with one another.

The following are advantageous developments of the present invention. Terminal transducer fingers dimensioned in the above described manner are provided at both ends of the transducer. In the case of a transducer having terminal transducer fingers at one transducer end dimensioned as described above, the other end of the transducer is provided with terminal fingers which are shortened in steps.

In the case of a transducer having terminal transducer fingers at one transducer end dimensioned as described above, the other end of the transducer is provided with terminal fingers which are directed obliquely with respect to a finger longitudinal part. In one embodiment the last transducer finger which corresponds to the scheme of the transducer is followed towards the transducer end by three terminal transducer fingers, of which the third last transducer finger has a smaller finger width, the second last transducer finger has a larger finger width, and the last, outermost transducer finger has again a smaller finger width, than a transducer finger which corresponds to the scheme of the transducer. Also, the intermediate spaces between the last transducer finger which corresponds to the scheme of the transducer and the third last transducer finger, and the intermediate space between the second last transducer finger and the last outermost transducer finger are larger than the intermediate space between transducer fingers of the scheme of the transducer. The number of terminal fingers which are dimensioned and positioned in a deviating manner at one transducer end is in the range of two to four.

The present invention is based on the knowledge that—with respect to the normal scheme, which corresponds to the specified design instruction, for the width and positions of the transducer fingers in the interior of the transducer—by modifying the finger width and the finger position of the last transducer finger at the relevant end of the transducer, preferably the last two to four fingers, satisfactory reflection suppression of reflections of terminal transducer fingers can be achieved. This measure is primarily provided at the mutually opposite ends of two such transducers of a filter. In the case of the invention, the neutralization of reflections which nevertheless occur at the transducer end despite a low-reflection finger arrangement of the transducer fingers is thus effected by interference occurring as a result of "incorrect positioning" and/or "incorrect dimensioning of the finger width" of the last finger/fingers. The invention can be used particularly well in the case of transducers having single fingers (in contrast to split fingers).

The measure according to the invention avoids the known phase front distortions which occur, for example, in a design having fingers which are shortened in steps. This design having fingers which are shortened in steps or the other known measures, which have already been mentioned above, for the suppression of reflections of terminal fingers cannot, however, on the other hand effect interference of the desired transmission quality of the filter at the averted end, that is to say at the end of a transducer facing the sump.

The following information should be given with respect to the dimensioning according to the invention of these "incorrect positioning" and "finger width deviations":

The reflections occurring in a transducer having a structure, for example a split finger structure, specified for the present application are calculated using methods from the prior art (IEEE Ultrason. Symp. Proc. (1985) pages 78–81) for interdigital transducers having finger positions, which are selected to be different in a specified manner, and finger widths of terminal transducer fingers (for a given frequency band). This is carried out with the aid of an iterative calculation process, using the least squares method. The iteration is terminated as soon as a geometry of four positionings or finger width deviations is achieved which results in satisfactorily low reflections (on the terminal transducer fingers). These are then the dimensions to be used for the individual case for the finger widths and for the incorrect positionings of the selected terminal transducer fingers, that is to say this produces the optimized deviations of dimensions and positions of the terminal transducer fingers with respect to the transducer fingers of the scheme of the central transducer fingers.

The relevant terminal transducer fingers are connected to one and the same busbar which is connected, in particular, to ground. The measure according to the invention does not interfere with wave phase fronts, there are no floating potentials and such transducers or filters constructed according to the invention can be produced using the normal technological measures of lithography. The deviations for the finger widths are between up to virtually double and approximately a fifth to a tenth of the finger widths of the transducer fingers of the scheme, the lithography determining the limit, for high frequencies, for the minimum width of a transducer finger. The (with respect to the scheme) selected changes in the finger intermediate spaces are in approximately the same variation range. Numerical examples are intended to clarify the orders of magnitude. A finger separation of 6.92 $\mu$m applies to a split finger transducer for a center frequency of 125 MHz for finger metallizations consisting of 0.3 $\mu$m of aluminum for the transducer fingers of the scheme, that is to say for fingers which are not terminal fingers. The same dimension applies to the finger width. Terminal fingers designed according to the invention have the following dimensions:

|  | Finger width | Finger separation |
| --- | --- | --- |
| Last finger | 0.70 $\mu$m | 6.38 $\mu$m |
| Second last finger | 4.33 $\mu$m | 7.66 $\mu$m |
| Third last finger | 0.70 $\mu$m | 3.56 $\mu$m |

With a finger width and finger separation of 6.59 μm for the fingers of the transducer scheme, the following figures result for the optimized terminal transducer fingers of a transducer having a third-lambda structure of a filter with a center frequency of 170 MHz and a 12% relative bandwidth:

|  | Finger width | Finger separation |
|---|---|---|
| Last finger | 4.20 μm | 0.84 μm |
| Second last finger | 2.89 μm | 3.92 μm |
| Third last finger | 6.96 μm | 1.35 μm |

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, and in which:

DESCRIPTION OF PREFERRED EMBODIMENTS

Figure 1:
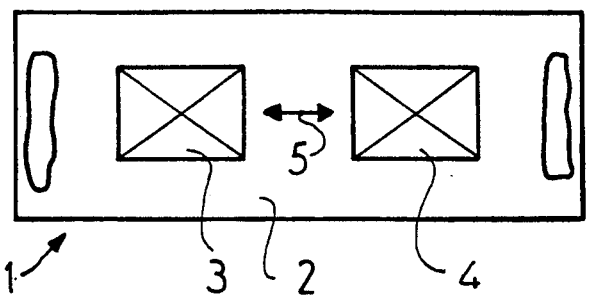
FIG. 1 shows a surface wave filter having two transducers

FIG. 1 shows schematically a surface wave filter 1 having a plate-shaped substrate 2 and having interdigital transducers 3 and 4 located on the surface of the substrate. The double-headed arrow 5 refers to the axis of the major propagation direction of the acoustic waves, which direction is produced by the one of the two transducers as a transmitting transducer and is received by the other transducer as a receiving transducer.

Figure 2:
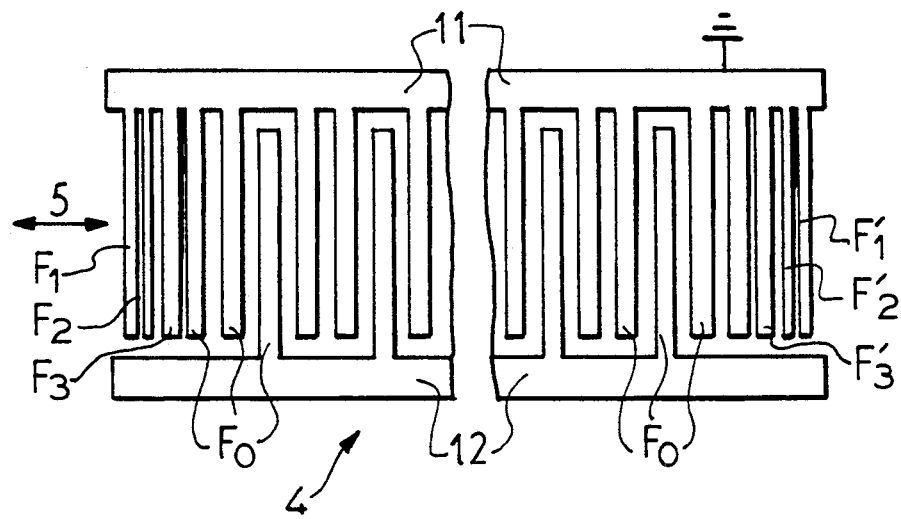
FIG. 2 shows a first embodiment of a transducer according to the invention.

FIG. 2 shows one of the transducers of the filter of FIG. 1, for example transducer 4. The transducer fingers F, which are electrically connected in each case to the one or to the other busbar, can be seen between the mutually opposite busbars 11 and 12. Transducer fingers corresponding to the specified scheme of the transducer are designated by $F_0$. As can be seen from FIG. 2, these transducer fingers $F_0$ are positioned regularly with respect to one another and have the same finger width. They fill the central part of the transducer 4 and, in the exemplary embodiment of FIG. 2, are arranged and distributed with respect to one another corresponding to a third-lambda transducer.

For completeness, it should be mentioned that these fingers $F_0$ may also be arranged at such separations which are different from one another and may be designed to have correspondingly different fingers widths, specifically as is adequately known by the person skilled in the art for a dispersive transducer. A transducer of this embodiment also forms part of the invention.

The transducer 4 of FIG. 2 corresponding to the invention has terminal transducer fingers $F_1$, $F_2$ and $F_3$ positioned at both ends and dimensioned with respect to the finger width. It can clearly be seen from FIG. 2 that both the finger widths and the distances between the fingers and the distance between finger $F_3$ and the adjacent finger $F_0$ are clearly dimensioned differently, to be precise differently from one another and differently with respect to the positions and finger widths of the finger $F_0$. This is the characteristic of the invention. The two fingers $F_1$ and $F_2$ are narrower than finger $F_0$ and are additionally at a distance from one another which is comparatively only very short. In contrast, the distance between the finger $F_2$ and the finger $F_3$ is greater, but is nevertheless smaller than the distance between the fingers $F_0$. The finger $F_3$ is broader than a finger $F_0$. The distance between the finger $F_3$ and the adjacent finger $F_0$, that is to say the first finger $F_0$ corresponding to the scheme of the transducer, is once again smaller than the normal finger separation between adjacent fingers $F_0$.

The other end of the transducer 4 has the corresponding fingers $F_1'$, $F_2'$ and $F_3'$, which are dimensioned and positioned according to the invention.

The fingers $F_1$, $F_2$ and $F_3$ are preferably connected to one and the same busbar 11, that is to say they are at the same potential, which is especially ground potential.

Figure 3:
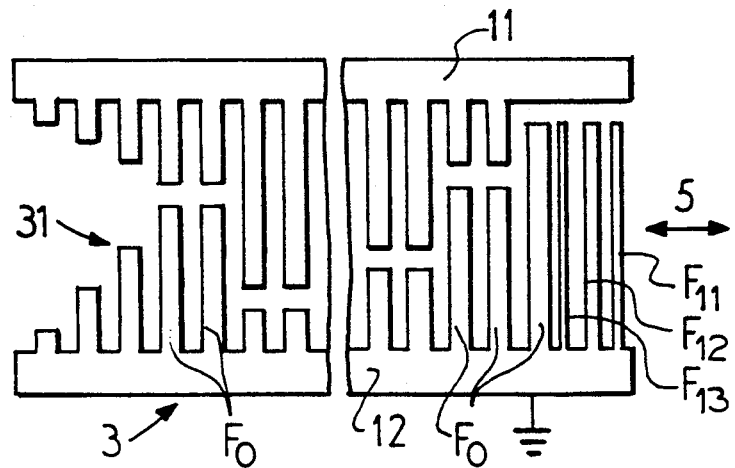
FIG. 3 shows an embodiment which contains the invention and combines a known measure.

FIG. 3 shows a transducer, which likewise corresponds to the invention, and is designated transducer 3. The transducer has fingers $F_0$ which are arranged and selected corresponding to a split finger transducer. The fingers $F_{11}$, $F_{12}$ and $F_{13}$ are once again the terminal transducer fingers which are positioned according to the invention and are dimensioned with respect to their finger width. In the case of transducer 3, the iteration method described above has resulted in a very narrow finger $F_{11}$, a likewise very narrow finger $F_{13}$ and a finger $F_{12}$ which in contrast is broader, the last finger nevertheless being narrower than a finger $F_0$. The separations of the fingers $F_{11}$, $F_{12}$, $F_{13}$ and of the finger $F_0$ from the adjacent finger 13, which are from the regular finger separations of the fingers $F_0$, can also be seen.

The end 31 of the transducer 3 located opposite this configuration according to the invention is constructed with fingers which are shortened in steps, in accordance with the abovementioned known prior art, instead of corresponding to the invention. If the transducers of FIGS. 2 and 3, as they are aligned in their figures, are located in the filter 1 of FIG. 1, the end of the transducer 3 with its fingers $F_{11}$, $F_{12}$ and $F_{13}$, and the end of the transducer 4 with its fingers $F_1$, $F_2$, and $F_3$ are located opposite one another. The reflections which would otherwise occur on terminal fingers of the interdigital converter do not occur here according to the invention, or are greatly suppressed. Because the fingers $F_1$, $F_2$, $F_3$ and $F_{11}$, $F_{12}$, $F_{13}$ are aligned in a common manner with respect to the axis 5, there are no disadvantageous influences on the wave front of the acoustic wave which occurs between the transducers 3 and 4.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A surface wave transducer having measures for suppressing internal reflections on terminal fingers of a transducer having other transducer fingers, which are arranged interdigitally adjacent to said terminal fingers, are arranged corresponding to a specified acoustic wavelength of the transducer at intervals specified by a predetermined scheme, and are designed with finger widths that are likewise specified by the predetermined scheme, comprising: terminal fingers on each end of the transducer and on each end of the transducer, only a plurality of terminal fingers which are connected to one busbar of the transducer, are positioned deviating from said scheme for positionings and finger widths of the other transducer fingers and are positioned deviating in their finger strip width, such that phases and amplitudes of wave components, which would otherwise be reflected by said terminal transducer fingers and by an adjacent final transducer finger of the other transducer fingers, which corresponds to the scheme of the transducer, are modified such that said wave components intrinsically interfere destructively with one another.

2. A surface wave transducer having measures for suppressing internal reflections on terminal fingers of a transducer having other transducer fingers, which are arranged interdigitally adjacent to said terminal fingers, are arranged corresponding to a specified acoustic wavelength of the transducer at intervals specified by a predetermined scheme, and are designed with finger widths that are likewise specified by the predetermined scheme, comprising: on at least one end of the transducer, only a plurality of terminal fingers which are connected to one busbar of the transducer, are positioned deviating from said scheme for positionings and finger widths of the other transducer fingers and are positioned deviating in their finger strip width, such that phases and amplitudes of wave components, which would otherwise be reflected by said terminal transducer fingers and by and adjacent final transducer finger of the other transducer fingers which corresponds to the scheme of the transducer, are modified such that said wave components intrinsically interfere destructively with one another, the final transducer finger which corresponds to the scheme of the transducer being followed towards the end of the transducer by three terminal transducer fingers, of which a third last transducer finger has a smaller finger width, a second last transducer finger has a larger finger width, and a last, outermost transducer finger has a smaller finger width again, that a transducer finger which corresponds to the scheme of the transducer and an intermediate space between the last transducer and the third last transducer finger, and an intermediate space between the second last transducer finger and the last outermost transducer finger being larger than an intermediate space between the other transducer fingers of the scheme of the transducer.

* * * * *